United States Patent [19]

Zimmer

[11] Patent Number: 4,951,219

[45] Date of Patent: Aug. 21, 1990

[54] METHOD AND A CIRCUIT FOR DETERMINING THE MOMENTARY FREQUENCY OF A SIGNAL

[75] Inventor: Manfred Zimmer, Ulm, Fed. Rep. of Germany

[73] Assignee: Licentia, Frankfurt, Fed. Rep. of Germany

[21] Appl. No.: 262,023

[22] Filed: Oct. 25, 1988

[30] Foreign Application Priority Data

Oct. 26, 1987 [DE] Fed. Rep. of Germany ....... 3736124

[51] Int. Cl.$^5$ ...................... G01R 23/00; G06F 15/20
[52] U.S. Cl. .................................. 364/484; 324/77 B; 364/572
[58] Field of Search ...................... 342/13, 14, 16, 20; 324/85, 77 K, 77 R, 79 D, 77 B, 79 R, 78 F, 78 D, 95; 375/82, 106; 364/484, 485, 486, 487, 572, 724.06

[56] References Cited

U.S. PATENT DOCUMENTS

| | | | |
|---|---|---|---|
| Re. 31,943 | 7/1985 | Ready | 324/77 B |
| 3,900,879 | 8/1975 | Lewinter | 324/85 |
| 4,194,206 | 3/1980 | Tsui et al. | 324/78 F |
| 4,426,648 | 1/1984 | Tsui et al. | 324/77 B |
| 4,547,727 | 10/1985 | Tsui et al. | 324/77 R |
| 4,612,545 | 9/1986 | Asendorf et al. | 324/77 B |
| 4,633,516 | 12/1986 | Tsui | 324/78 D |
| 4,644,267 | 2/1987 | Tsui et al. | 324/77 K |
| 4,695,790 | 9/1987 | Mathis | 324/77 K |
| 4,745,356 | 5/1988 | Henze | 324/77 H |
| 4,791,360 | 12/1988 | Gagnon et al. | 324/78 F |

FOREIGN PATENT DOCUMENTS 2027297 2/1980 United Kingdom .

OTHER PUBLICATIONS

"Digital Instantaneous Frequency Measurement for EW Receivers," *Microwave Journal Magazine*, vol. 28, No. 2, Feb. 1985.

*Primary Examiner*—Kevin J. Teska
*Attorney, Agent, or Firm*—Spencer & Frank

[57] ABSTRACT

A method and a circuit for determining the momentary frequency of an analog signal s(t) which is variable over time within a given frequency bandwidth Δf, as an N-bit number in an N-bit coding range. The circuit includes N detector cells which operate in parallel according to the interferometer principle directly in the original frequency range, to produce respective bit values of the momentary frequency according to a digital code, the bit positions of the code having either odd or even bit functions with respect to the middle of the coding range, depending on the code. Each cell receives from a signal/phase distributor different phases of the signal and with the use of delay elements, comparators and EX-OR and/or EX-NOR gates, depending on whether the cell corresponds to a bit position having an even or an odd bit function, produces an output according to a corresponding equation. For an i-th cell corresponding to the i-th ordered bit position of N, having an odd bit function, the output $squ_i(t)$ is given by $squ_i(t) = \text{sgn}[s(t) - s(t-2T_i)] \oplus \text{sgn}[-js(t-T_i)]$, where "sgn" represents the sign function signum, "j" represents a 90° phase shift of the signal, $T_i$ equals to $2^{1-i}\tau$ where $\tau$ is a common delay increment, and "$\oplus$" represents 1-bit modulo addition. For a cell corresponding to a bit position having an even bit function, the output $sqg_i$ is given by $sqg_i(t) = \text{sgn}[s(t) + s(t-T_i)] \oplus \text{sgn}[s(t-T_i/2)]$.

21 Claims, 14 Drawing Sheets

METHOD AND A CIRCUIT FOR DETERMINING THE MOMENTARY FREQUENCY OF A SIGNAL

BACKGROUND OF THE INVENTION

The present invention relates to a method and an electrical circuit for determining the momentary (instantaneous) frequency of a signal which is variable over time within a given frequency bandwidth.

Such a method is disclosed, for example, in "Digital Instantaneous Frequency Measurement for EW Receivers," Ralph Bauman, Microwave Journal, Volume 28, No. 2 (February, 1985) pages 147-154. For the rapid detection of high and very high frequencies (f>1 GHz), essentially only special parallel methods can be employed, particularly those operating according to the so-called "interferometer principle" which originates from the optical art and uses coherent superposition of phase-shifted wave trains of the same frequency and the same amplitude. These methods basically employ one or several delay lines or delay elements to produce the necessary frequency proportional phase shifts $\Theta(f)$ of the input signal s(t). The mathematical relationship between the signal delay time $\tau$ and the signal phase shift $\Theta$ in a homogeneous, low-loss delay line $D_i$ is given by $\Theta_i(f) = 2\pi f\tau$ where $\tau = 1/\Delta f$ ($\Delta f$=detection bandwidth) and thus the complex output amplitude $$\overline{B}_i = \overline{A}_i e^{-j\Theta_i}$$

applies for a complex input amplitude $\overline{A}_i$.

Frequency independent (constant) signal phases $\overline{A}_i$, formed from input signal s(t) and selected according to a certain mathematical rule, must be fed into the parallel arranged delay lines. These signal phases $\overline{A}_i$ can be selected by means of a microwave stripline network or by a hybrid coupler network.

In the known method, the actual frequency detections are obtained from the parallel, delayed signal phases $\overline{B}_i$ by means of frequency discriminator networks and correlators which are purely analog circuits. For this purpose, further passive phase shifting networks are employed in conjunction with high frequency mixers which, by special phase summations of the delayed complex amplitudes $\overline{B}_i$ and subsequent signal mixing (quadrature mixing), form the frequency value components $W_i$. These frequency value components $W_i$ must now be separated by lowpass filtering from the further mixing products (harmonics of s(t)) and must be combined by subsequent difference formations, e.g. by means of video differential amplifiers, so that the individual, desired analog frequency values W(f) result. Only then can the frequency values W(f) be digitalized in the lowpass filter range by means of special analog/digital converters and phase/digital converters.

Thus, in the known method, in spite of its parallel basic structure, the individual signals must travel very long processing paths through the many different components to reach the frequency value output. This, and primarily the finite bandwidth ($B_v < 100$ MHz) of the differential amplifiers, requires a correspondingly long response time taq in the frequency detectors. In the conventional methods, this response time lies at taq>70 ns and is thus too long for a precise evaluation of microwave pulses which have a duration of tp<100 ns.

However, the demand for very fast digital momentary frequency detectors is presently growing at a fast rate for real time signal processing in satellite radio, satellite television, space travel communications, directional radio, radar and for digital UHF receivers in all commercial and military applications. This trend is decisively supported by the increased occurrence of novel, monolithically integrated microwave circuits (MMIC's), particularly digital circuits (gigabit logic) in GaAs-FET (field effect transistors) and high speed ECL (emitter coupled logic) technology.

SUMMARY OF THE INVENTION

It is therefore an object of the present invention to provide a method for the momentary frequency determination of very high frequencies and a circuit arrangement for implementing such a method.

A purely parallel method according to the invention, for a digital determination of momentary frequencies based on the "interferometer principle", utilizes in a special way the mathematical (orthogonal) characteristics of trigonometric functions. Ultimately the frequency detections originate from sign determinations of corresponding, phase-shifted (delayed) signal sums. For a determination of the signs, the modulo additions of digital signals by means of Exclusive-OR/NOR gates are utilized.

In particular the method and a circuit for determining the momentary frequency, in accordance with the invention produces the momentary frequency of an analog signal s(t) which is variable over time within a given frequency bandwidth $\Delta f$, as an N-bit number in an N-bit coding range using a circuit which includes N parallel operating detector cells which operate directly in the original frequency range. The cells produce respective bit values of the momentary frequency according to a digital code, the bit positions of the code having either an odd or an even bit function with respect to the middle of the coding range, depending on the code. Each cell receives from a signal/ phase distributor different phases of the analog signal s(t) and with the use of delay elements, comparators and EX-OR and/or EX-NOR gates, depending on whether the cell corresponds to a bit position having an even or an odd bit function, produces an output in accordance with a corresponding rule. In the case of an i-th cell corresponding to the i-th of N ordered bit positions, having an an odd bit function, the output $squ_i$ (t) is given by $squ_i(t) = \text{sgn}[s(t) - s(t - 2T_i)] \oplus \text{sgn}[-js(t - T_i)]$, where "sgn" represents the sign function signum, "j" represents a 90° phase shift of the signal, $T_i$ is equal to $2^{i-1}\tau$ where $\tau$ is a common delay increment, typically equal to $1/\Delta f$ where $\Delta f$ is the detection bandwidth and "$\oplus$" represents the 1-bit modulo addition. In the case of a cell corresponding to a bit position having an an even bit function, the output $sqg_i$ is given by $sqg_i(t) = \text{sgn}[s(t) + s(t - T_i)] \oplus \text{sgn} \cdot [s(t - T_i/2)]$.

The individual signal processing steps covered by the above rules, such as producing defined signal delays and phase shifts, addition and subtraction of two signals, generating a sign signal and 1-bit modulo addition can be performed with known, fast and simply constructed component groups. Particularly advantageous embodiments will be described in detail in connection with a description of the drawing figures. The lack of complexity connected therewith makes an arrangement for the implementation of the method according to the invention particularly suitable also for integration on one or a few semiconductor components. The minimum response time taq lies in an order of magnitude of about twice the maximum delay time in the delay unit so that an extremely fast digital frequency detection of high and ultrahigh frequency pulses up to pulse widths in the pico-second range is possible. Due to the fact that great word widths are possible in principle, it is possible to determine the frequencies with high accuracy. The method according to the invention operates as a purely parallel method with the digital frequency detection taking place directly in the bandpass range of the input signal s(t). Instead of the mixer stages, lowpass filters and differential amplifiers of conventional arrangements, comparators and logic gates can be employed. The sign function permits an early transition to digital signals and, in particular, the signals after 1-bit modulo addition, already represent the digital frequency values in the selected code so that special digitalization stages are no longer required. The code selection which determines the type of the alternatively provided signal processing rules (even or odd) for the individual code positions is free, in principle, so that, for example, the binary code as well as the Gray code or a mixed binary-Gray code may be selected.

BRIEF DESCRIPTION OF THE DRAWINGS

These and other features and advantages of the invention are described below in greater detail in a detailed description of the preferred embodiments with references to the accompanying drawings in which.

DESCRIPTION OF THE PREFERRED EMBODIMENTS

Figure 11A:
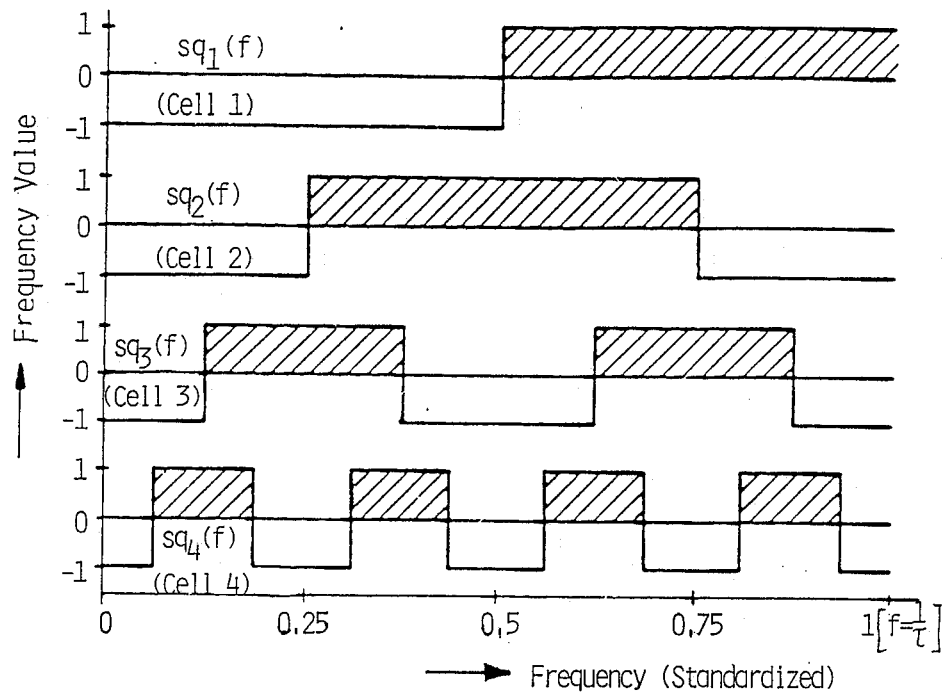
FIGS. 11A and 11B are graphs showing respectively the associated characteristics of the individual detector cells (A) and the association of the bit values of the code positions with the code values (B) of the coding range for the arrangement of FIG. 10.
Figure 11B:
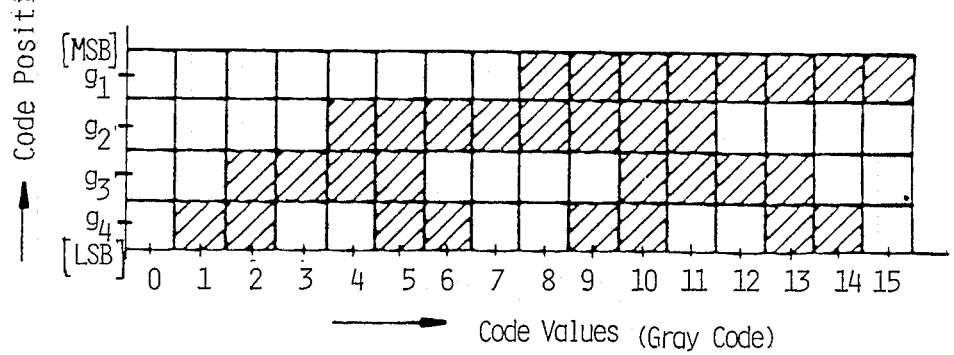
Figure 13A:
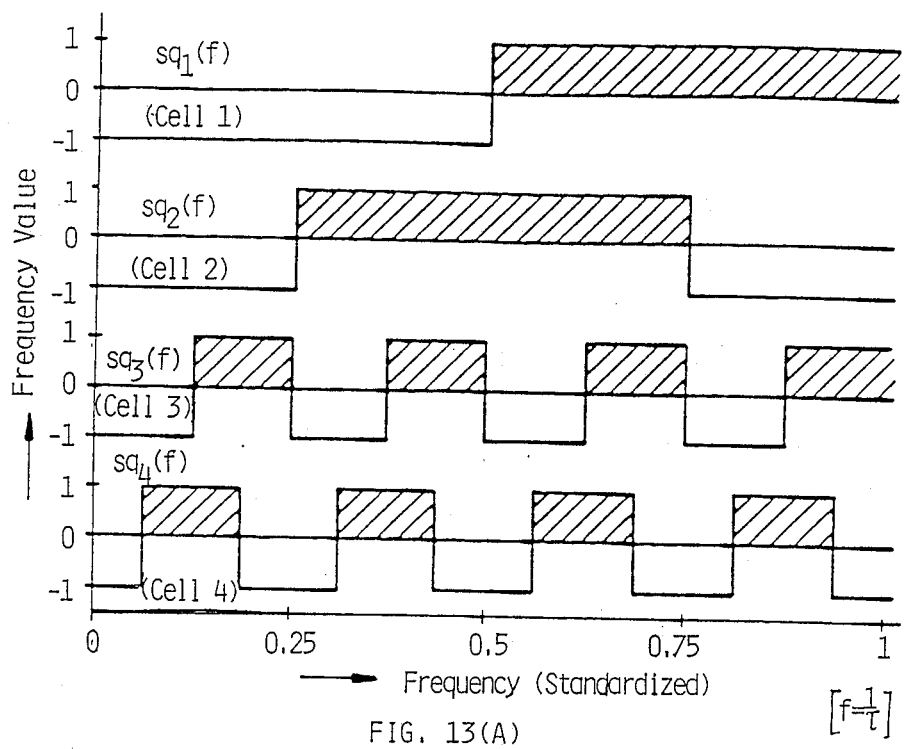
FIGS. 13A and 13B are graphs showing respectively the associated characteristics of the individual detector cells (A) and the association of the bit values of the code positions with the code values (B) of the coding range for the arrangement of FIG. 12.
Figure 13B:
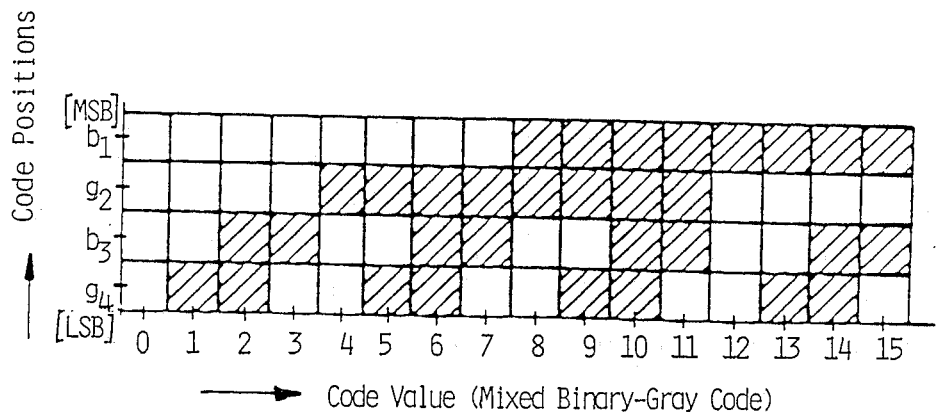

The terms employed for the bit functions of an individual code position which are even or odd with respect to the middle of the coding range are particularly clear in the embodiment of FIG. 13(B) for 4-bit coding in a mixed binary-Gray code with code positions $b_1$ (MSB=most significant bit), $g_2$, $b_3$ and $g_4$ (LSB=least significant bit). Here b designates binary code and g designates Gray code. Hatched or unhatched fields represent the states H (high) and L (low) (or $+1/-1$) of the respective code position at the different code values which, corresponding to the 4-bit coding system, include values from 0 to 15. The middle of the coding range then lies at the transition from code value 7 to code value 8. The figure shows directly that binary code positions $b_1$ and $b_3$ exhibit an odd (or antisymmetrical) bit function with respect to the middle of the range, while Gray code positions $g_2$ and $g_4$ exhibit an even (or symmetrical) bit function with respect to the middle of the range. Similarly, in the embodiment of FIG. 9(B), all code positions $b_1$, $b_2$, $b_3$ and $b_4$ can be seen to have odd bit functions, while in the embodiment of FIG. 11B only code position $g_1$ has an odd bit function and the remaining code positions $g_2$, $g_3$ and $g_4$ have even bit functions. The arrangement for other word lengths and other codes can easily be made correspondingly.

Figure 1:
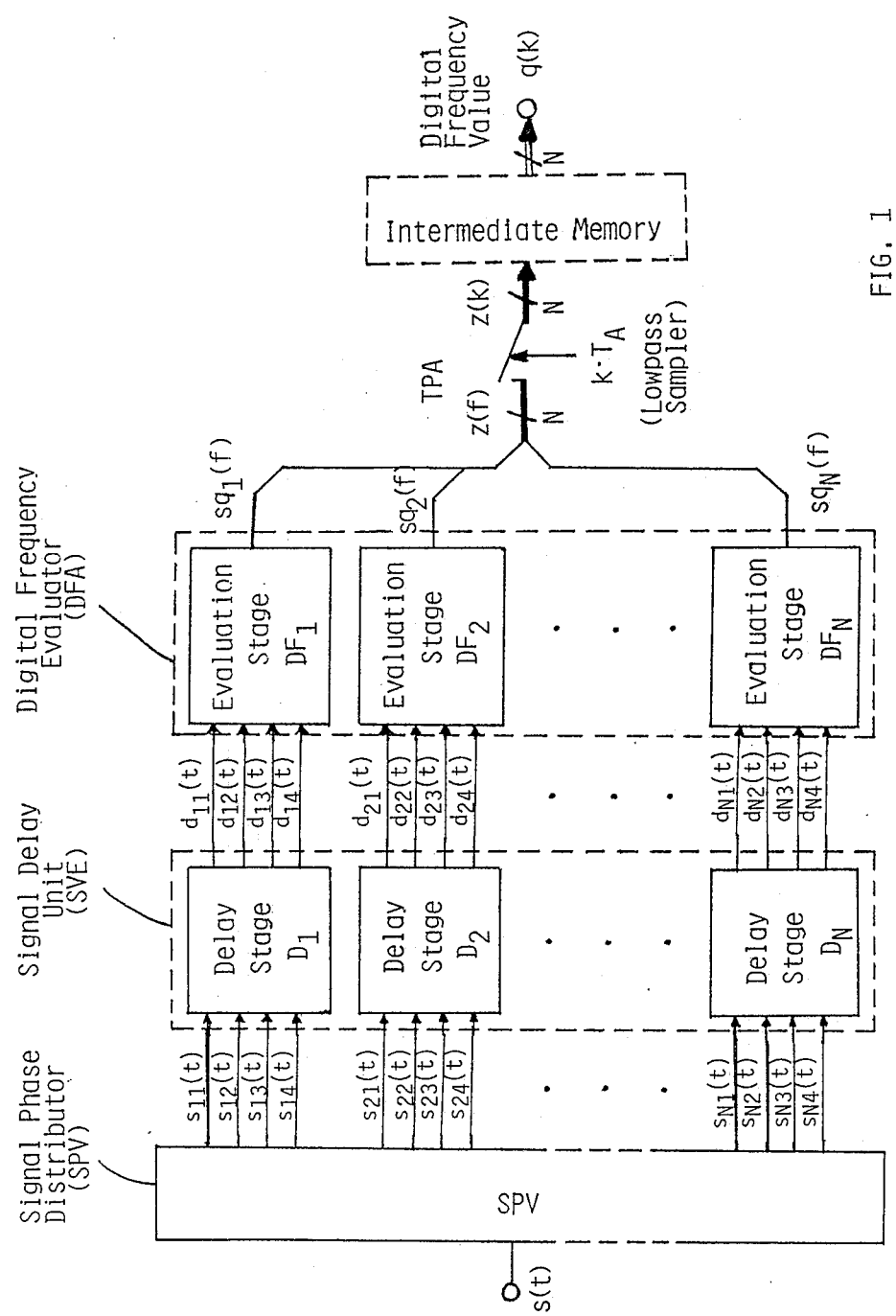
FIG. 1 shows a basic block circuit diagram of a digital momentary frequency detection (DMFD) arrangement.

According to circuit diagram shown in FIG. 1, an N-bit digital momentary frequency detector for a (prefiltered and amplified) input signal s(t) according to the novel method and circuit of the invention essentially includes a signal/phase distributor SPV followed by a signal delay unit SVE which, in turn, is followed by the actual digital frequency evaluator DFA. Here, the signal/phase distributor SPV furnishes 4 times N signal phases $s_{i,n}(t)$ (where i=1, ..., N) to the signal delay unit SVE, and the signal delay unit SVE also furnishes 4 times N delayed signal phases $d_{i,n}(t)$ to the digital frequency evaluator DFA. Further, the signal delay unit SVE is subdivided into N delay stages $D_1$ to $D_N$ and the digital frequency evaluator DFA is likewise subdivided into N evaluation stages $DF_1$ to $DF_N$. The various stages $D_i$ and $DF_i$ are each identical in their basic internal circuit structure. However, the signal delays $T_i$ of delay stages $D_i$ must be staggered by whole number integers according to the processing rule defined for the respective code positions. The output signals $sq_i$ of stage $DF_i$ represent the bit values of the individual code positions of the digital momentary frequency value z(f). A subsequent lowpass sampler and intermediate memory—realizable in the form of an output register—is provided for the synchronization of the frequency value sequences $sq_i(f)$ and the digital value z(f) with a system clock pulse $k \cdot T_A$ for further processing as digital frequency value q(k). However, this known lowpass sampler with intermediate memory is not the subject of the present invention.

The individual bits (sequences $sq_1(f)$ to $sq_N(f)$) of the digital frequency values are formed in each case by a series connection of the respective delay stage $D_i$ with the corresponding evaluation stage $DF_i$. This series connection ($D_i$, $DF_i$) thus constitutes the actual detector cell of the momentary frequency detection arrangement and consequently is present N times for an N-bit frequency detection system. However, the dimensions of the internal signal delay $T_i$ and possibly also the phase position of signal phases $s_{i,n}(t)$ should here be selected to be different from detector cell to detector cell and a corresponding signal/phase distributor SPV should be provided at the signal input.

Figure 2A:
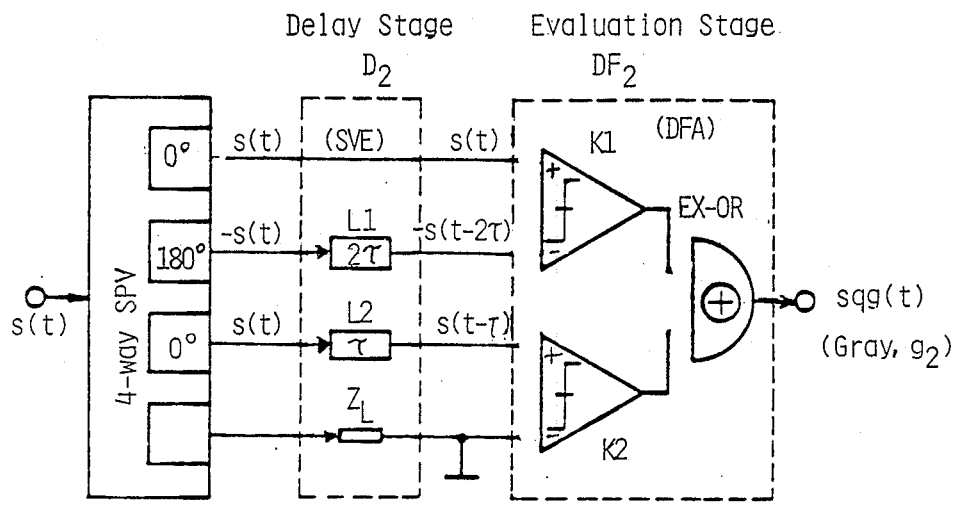
FIG. 2(A) is a basic circuit diagram of an even version of an individual detector cell.

The orthogonality of the trigonometric functions now permits two basic, differently dimensioned detector cells whose selection is ultimately determined by the selected type of code (Gray code, binary code) of the digital frequency values z(f) and q(k), respectively. FIG. 2A shows the even version (e.g. for Gray code position g2) and FIG. 3A the odd version (e.g. for binary code position b1).

The individual detector cells (i=1, ..., N) are identified by special signal processing rules which can be stated with the aid of the sign function sgn and 1-bit modulo addition $\oplus$ for the even version as $$sqg_i(t) = \pm sgn[s(t) + s(t - T_i)] \oplus sgn[s(t - \tfrac{1}{2}T_i)] \qquad (1)$$

and for the odd version as $$squ_i(t) = \pm sgn[s(t) - s(t - 2T_i)] \oplus sgn[-j \cdot s(t - T_i)] \qquad (2)$$

with the code position specific delay time $T_i$ of the $i^{th}$ code position (i=rank of the code position, MSB: i=1) being dimensioned as a whole number multiple of the delay increment $\tau$, and in particular as $T_i = 2^{i-1} \cdot \tau$. The associated characteristic functions (detection functions) should accordingly be given as (a) even version:

$$sqg_i(f) = \mp sgn \, 2 \cdot \{\cos[\pi f \cdot T_i]\} \qquad (3)$$

(b) odd version:

$$squ_i(f) = \mp sgn \, 2 \cdot \{\sin[2\pi f \cdot T_i]\} \qquad (4)$$

The double signs represent the possible selections between the normal and the inverted form. The accuracy of Equations (1) to (4) can be verified for the even detector cell with the aid of a simple calculation where i=2, $T_i = 2\tau$ according to FIG. 2A, as follows.

Using $$\begin{aligned} s(t) &= A \cos(wt), \ (w = 2\pi f, A = \text{signal amplitude}) \\ s(t - \tau) &= A \cos w(t - \tau) = A \cos(wt - \theta) \\ s(t - 2\tau) &= A \cos w(t - 2\tau) = A \cos(wt - 2\theta) \end{aligned} \qquad (5)$$

where the delay angle $w\tau = \Theta$ is employed, Equation (1) reads as follows:

$$sqg_2(t) = \pm sgn \, A[\cos(wt) + \cos(wt - 2\Theta)] \oplus sgn \, A[\cos(wt - \Theta)] \qquad (6)$$

To make Equation (6) accessible to customary algebraic calculation operations, it must be revised accordingly. Initially, the modulo summation can be replaced equivalently by a division $$sqg_2(t) = \mp sgn \frac{[\cos(wt) + \cos(wt - 2\theta)]}{\cos(wt - \theta)} \qquad (7)$$

or by a multiplication $$sqg_2(t) = \mp sgn \, A^2 \{[\cos(wt) + \cos(wt - 2\Theta)] \cdot [\cos(wt - \Theta)]\} \qquad (8)$$

The analog and digital characteristic functions for the two Equations (7) and (8) are shown in FIGS. 4A and 4B and 5A and 5B, respectively, for the even detector cell (A) as well as for the odd detector cell (B). This shows that with respect to the sign operations (sgn), multiplications produce the same result as divisions.

It is significantly easier when calculating further to operate with the division form of Equation (7). This also corresponds physically to a demodulation process $2\pi f = d\phi/dt$. To calculate the analog frequency detection function (characteristic), it is assumed that only the part of Equation (7) which has no sign is employed, as follows:

$$sag \, (t) = \frac{[\cos(wt) + \cos(wt - 2\theta)]}{\cos(wt - \theta)} \qquad (9)$$

With the aid of the addition theorem $$\cos \alpha + \cos \beta = 2 \cos \frac{\alpha + \beta}{2} \cos \frac{\alpha - \beta}{2} \qquad (10)$$

of the trigonometric function, the numerator of Equation (9), where $\alpha = wt$ and $\beta = wt - 2\Theta$, can be changed to $$2\cos \frac{wt + wt - 2\theta}{2} \cos \frac{wt - wt + 2\theta}{2} = \qquad (11)$$

$$2\cos(wt - \theta) \cdot \cos(\theta)$$

This, inserted in Equation (9), results in the analog characteristic of the even detector cell as follows:

$$sag \, (t) = 2 \frac{\cos(wt - \theta) \cos(\theta)}{\cos(wt - \theta)} = 2\cos(\theta) \qquad (12)$$

This cell is now only frequency dependent ($\Theta = 2\pi f\tau$) and thus is identical with the part of characteristic Equation (3) which has no sign. The characteristic function, Equation (4), for the odd detector cell can be determined correspondingly. According to the odd version shown in FIG. 3A and with the orthogonal statements for Equations (5), there then results the quotient equation corresponding to Equation (7):

$$squ \, (t) = \mp sgn \frac{[\cos(wt) - \cos(wt - 2\theta)]}{-\sin(wt - \theta)} \qquad (13)$$

for the odd detector cell. The use of the same calculation scheme, performed the same as for a determination of the even detector cell, based on Equation (13), then furnishes as its result the analog characteristic $$sau(t) = -2 \frac{\sin(wt - \theta) \cdot \sin(\theta)}{-\sin(wt - \theta)} = 2 \sin(\theta) \qquad (14)$$

for the odd detector cell. This unequivocally determines the dimensioning basis for the individual detector cells as well as for the entire digital momentary frequency detection method. FIGS. 3 and 3B show the basic structure (A) and the associated characteristics (analog and digital) (B) for i = 1, i.e. $T_i = \tau$ and $\Theta = 2\pi f\tau$.

The schematic illustration of a circuit for carrying out the method according to the invention shown in FIG. 1 is thus essentially based on the use of Equations (1) to (4) and thus permits extremely fast and accurate momentary frequency detections of short-term signals far up into the GHz frequency range (e.g. of microwave pulses). For a practical realization, only parallel arrangements of special detector cells are applicable for this purpose if they are each supplied with correspondingly phase-shifted input signals from a signal/phase distributor (SPV). The addition of two analog signals may here advantageously be performed by subtraction in a comparator with simultaneous performance of the sign formation in that one of the signals to be added is shifted in phase by 180° in the signal phase/distributor SPV.

Thus, in the arrangement for a detector cell for the realization of the even processing rule schematically illustrated in FIG. 2(A) where i=2 (and thus $T_i = 2\tau$), the signal/phase distributor SPV makes available from the (bandpass filtered) input signal s(t) four signal components (corresponding to $s_{21}$ to $s_{24}$ in FIG. 1) for the signal delay unit. Although, according to Equation (1), a set of only three different signal components are required, the signal/phase distributor SPV, whose structure will be described in greater detail below, furnishes a fourth signal component in each case for output signals without mutual differences in delay, but this fourth signal component is not evaluated and its phase is therefore irrelevant. Corresponding to the first modulo summand in Equation (1), a first signal is fed without delay through signal delay stage $D_2$ to the non-inverting input of a first comparator K1 at whose inverting input there appears the signal component which was inverted in the signal/phase distributor SPV by way of a 180° phase shift and delayed by $T_i = 2\tau$ in delay line L1 of delay stage $D_2$. Due to the double inversion of the delayed signal component, the sign signal of the signal sum of the first modulo summand of Equation (1) appears at the output of comparator K1.

The second modulo summand contains only one signal component. This signal component is delayed by $\frac{1}{2}T_i = \tau$ in the delay stage through delay line L2 without phase shift in the signal/phase distributor SPV and is fed to the non-inverting input of the second comparator K2 whose inverting input is at reference potential and whose output signal therefore already constitutes the sign of this signal component. In the subsequently connected EX-OR gate, the digital output signals of the comparators are linked into the bit value sqg2 which, for example, may represent the second code position g2 of a Gray code. The fourth output of the signal/phase distributor is terminated free of reflections by the characteristic impedance $Z_L$.

Figure 2B:
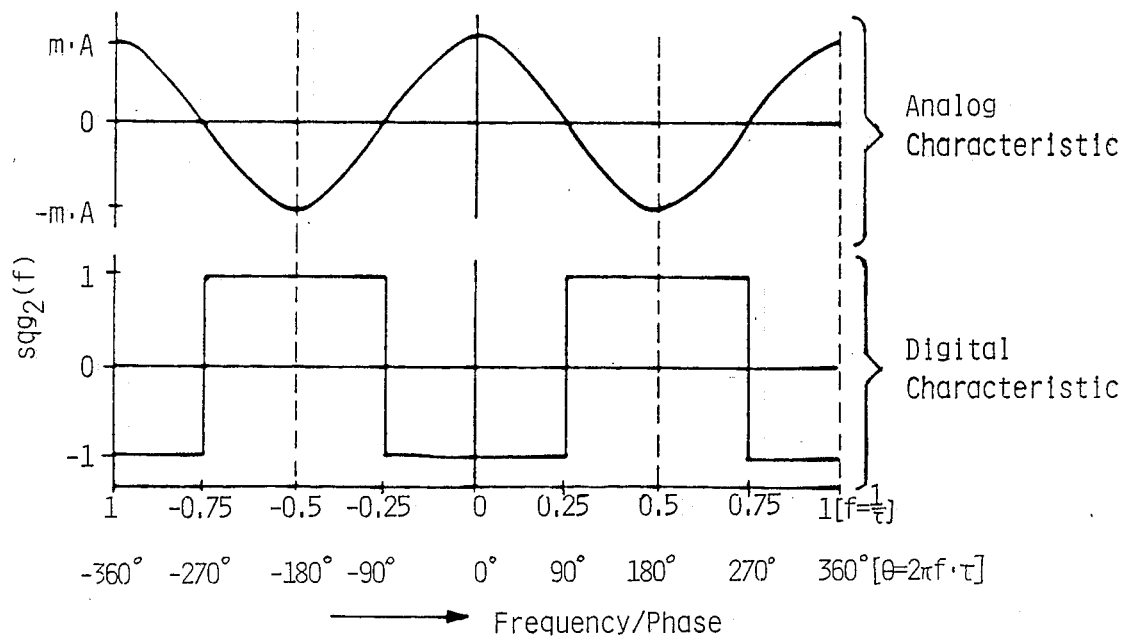
FIG. 2(B) is a graph showing the associated curves for the even signal processing rule.

FIG. 2(B) shows the associated digital characteristic and, above it, for comparison, the analog characteristic corresponding to Equation (12). The characteristics are plotted over the standardized frequency and the corresponding delay phase angle $\Theta$ for the double frequency resolution range (f = -1 to +1).

Figure 3A:
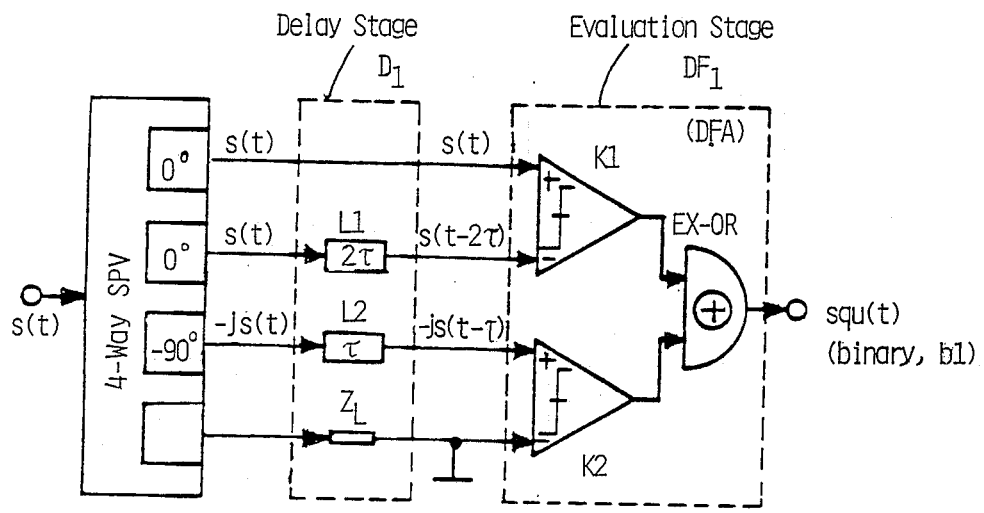
FIG. 3(A) is a basic circuit diagram of an odd version of an individual detector cell.
Figure 3B:
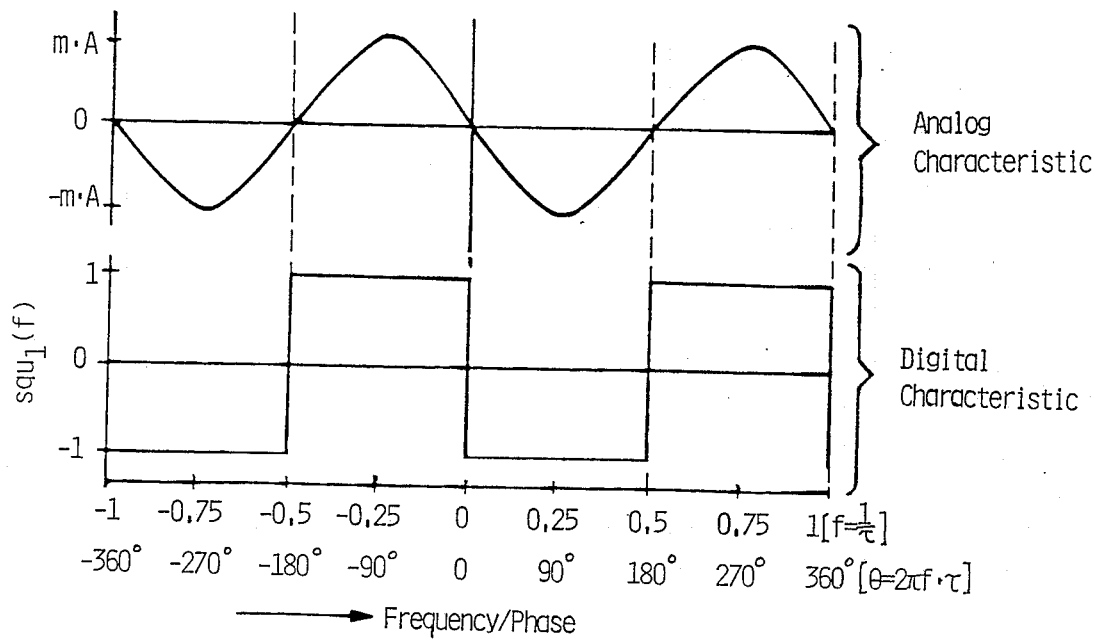
FIG. 3(B) is a graph showing the associated curves for the odd signal processing rule.
Figure 4A:
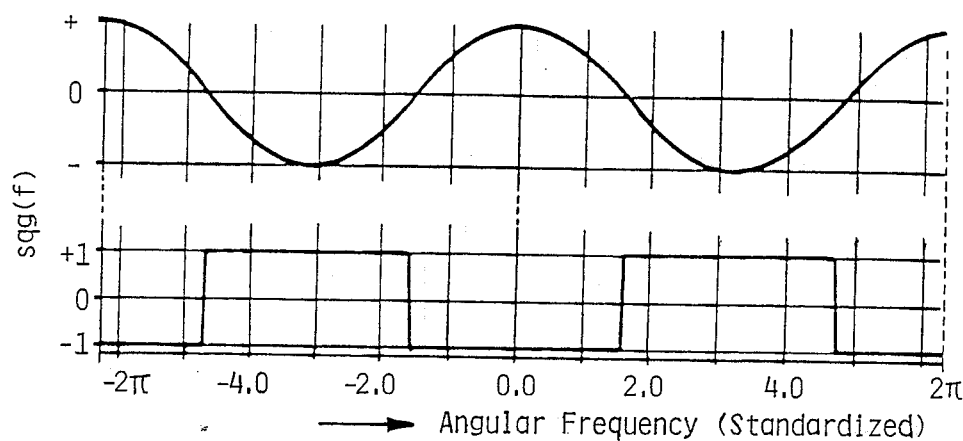
FIGS. 4A and 4B are graphs showing analog and digital characteristic functions respectively of the even (A) and odd (B) version for a derivation in quotient form.
Figure 4B:
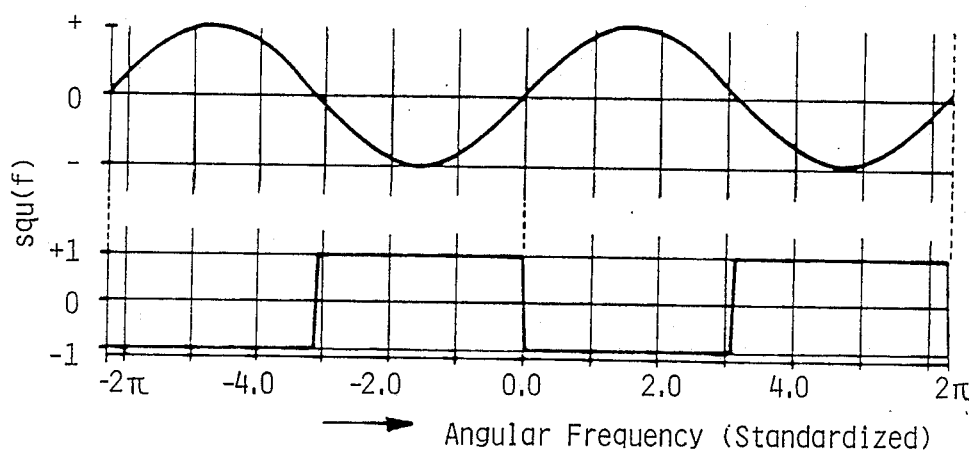
Figure 5A:
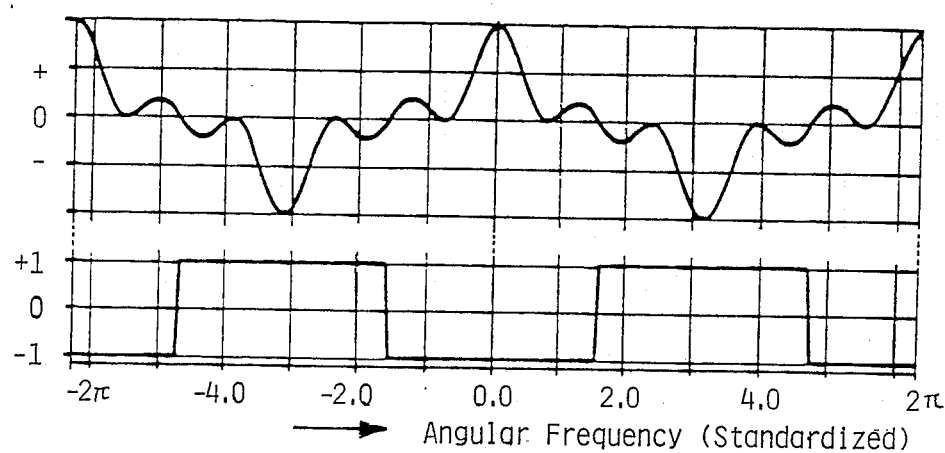
FIGS. 5A and 5B are graphs showing analog and digital characteristic functions respectively of the even (A) and odd (B) version for a derivation in product form.
Figure 5B:
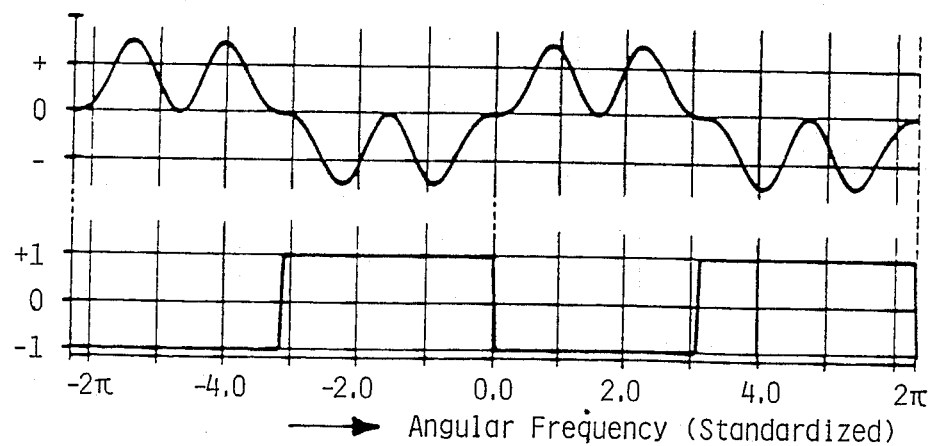

FIG. 3(A) shows the corresponding arrangement of a detector cell for the realization of the odd processing rule for i=1 and thus $T_i = \tau$, in which, according to Equation (2), the signal/phase distributor SPV furnishes to delay stage $D_1$, in addition to two identical phase signal components, a signal component shifted in phase by 90°. The output signal squ of this detector cell forms, for example, the MSB b1 of a binary code for the digital frequency value. FIG. 3(B) again shows the associated characteristics.

Figure 6:
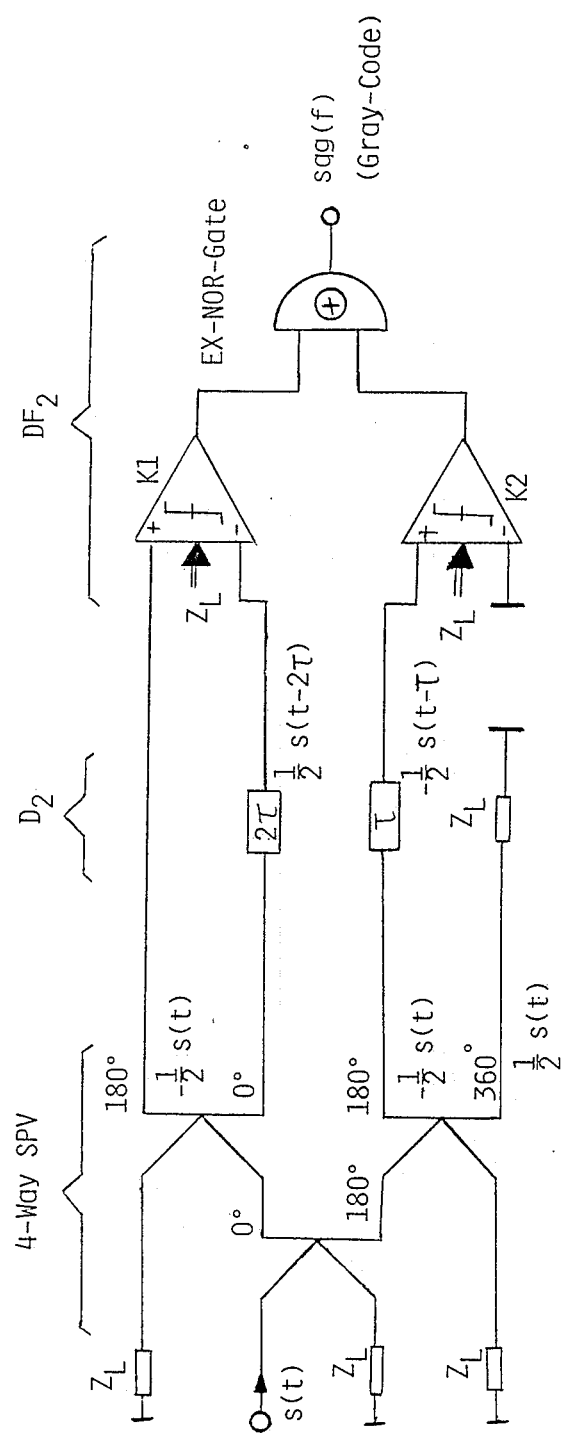
FIG. 6 is a circuit diagram of the structure of a detector cell for the even rule.
Figure 7:
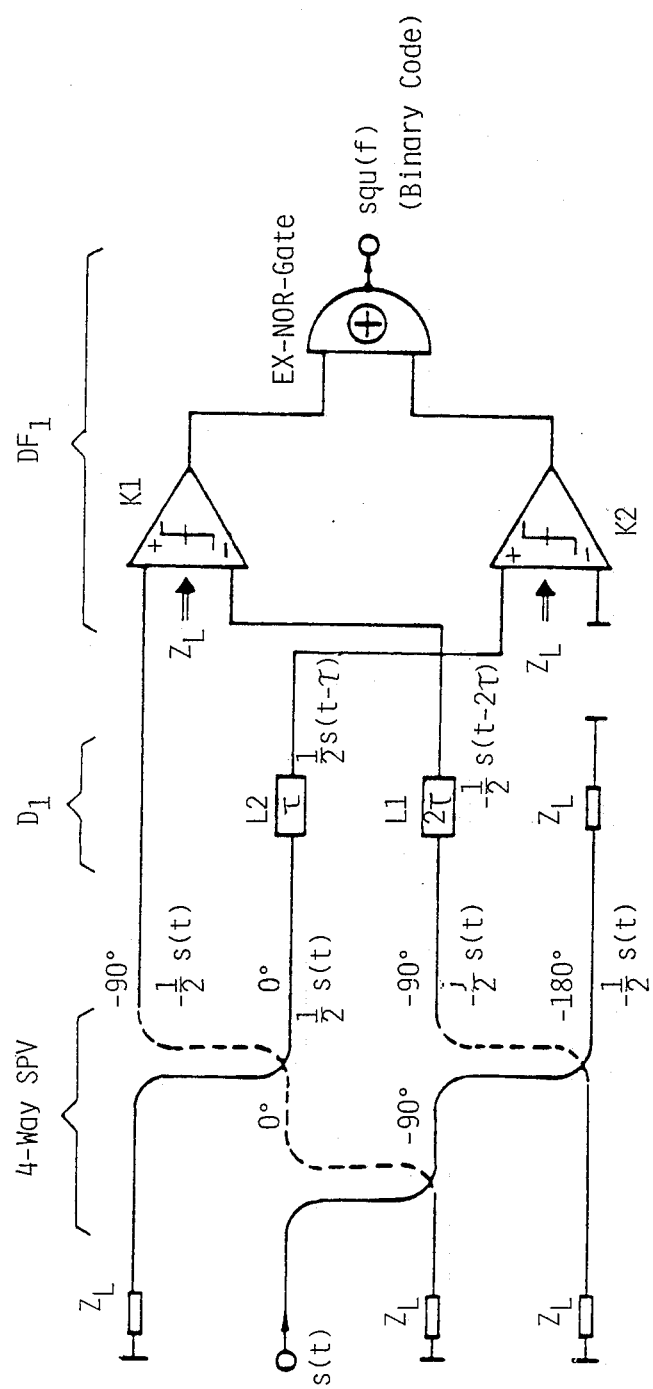
FIG. 7 is a circuit diagram of the structure of a detector cell for the odd rule.

FIGS. 6 and 7 show advantageous embodiments and further details regarding the signal/phase distributors SPV for the examples shown in FIGS. 2(A) and 3(A). The phase values entered here sometimes differ from the phase values of FIGS. 2(A) and 3(A) but, as can easily be demonstrated, lead to the same output signals sq(f). This also illustrates that there are different equivalent ways to arrive at the circuitry realization of the stated signal processing rules The four-way signal/phase distributor SPV of the even momentary frequency detector cell can be constructed very simply, as shown in FIG. 6, from three identical 3 dB 180° hybrid couplers. Embodiments in stripline technology, proven in the art, are here preferred for the hybrid couplers. The odd momentary frequency detector cell can be constructed just as simply, as shown in FIG. 7, with a four-way signal/phase distributor SPV which is here composed of three identical 3 dB 90° hybrid couplers. Since certain phase relationships of the signals must be maintained within the detector circuit for the correct operation of the detector cells, the respective four-way signal/phase distributor SPV is interconnected with delay stage $D_i$ and with evaluation stage $DF_i$ according to Equation (1) or Equation (2), as also schematically illustrated, for example, in FIGS. 2(A) and 3(A). The unutilized coupler terminals are each terminated without reflection by an impedance $Z_L$.

With such 1-bit detector cells it is now possible to construct momentary frequency detection arrangements for almost any desired word widths N of frequency values q(k), selectively in the binary code or in the Gray code. This will now be described in greater detail by way of three examples for 4-bit momentary frequency detectors.

Figure 8:
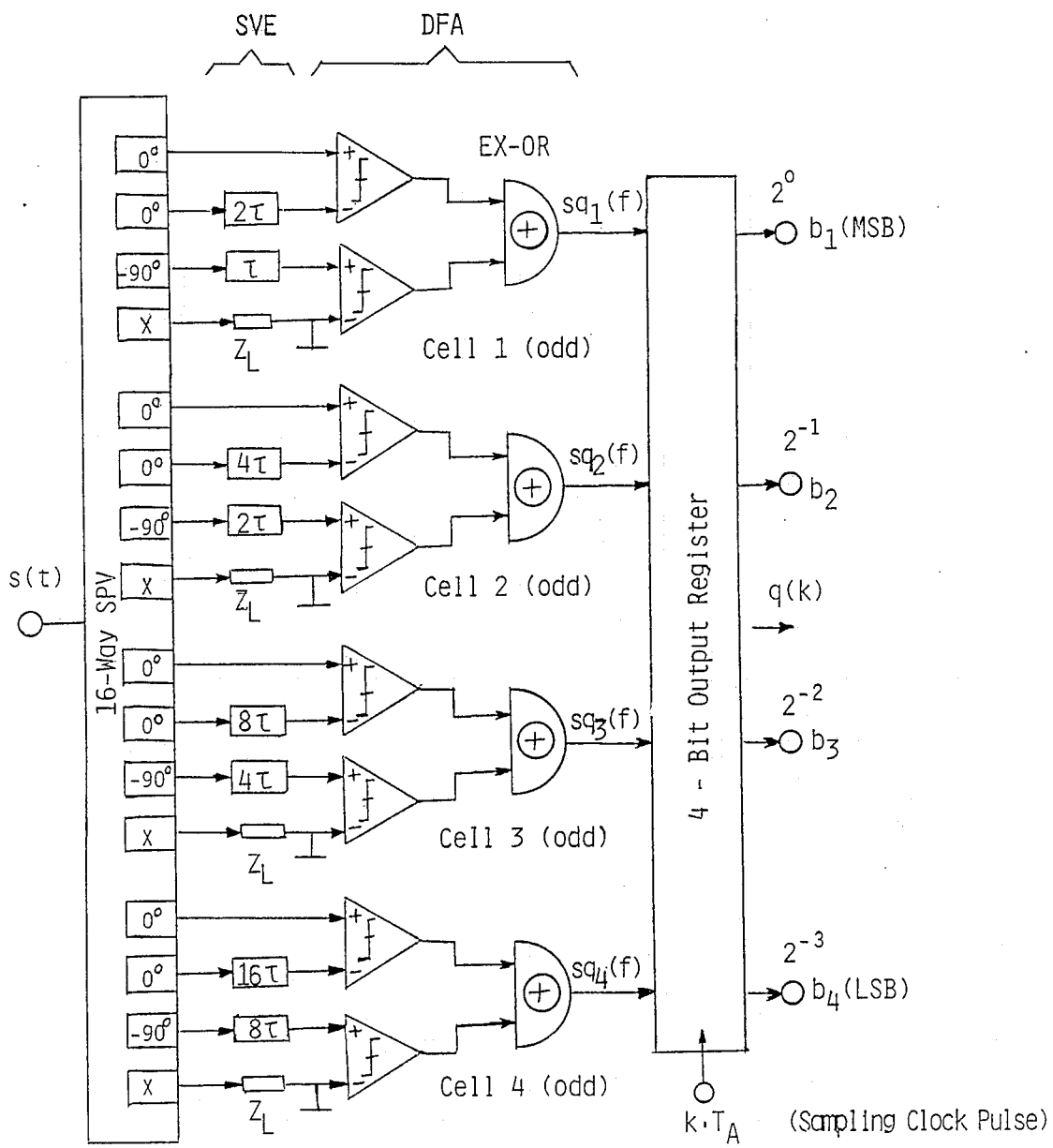
FIG. 8 is a circuit diagram of the structure of a 4-bit momentary frequency detection arrangement for frequency value output in a binary code.
Figure 9A:
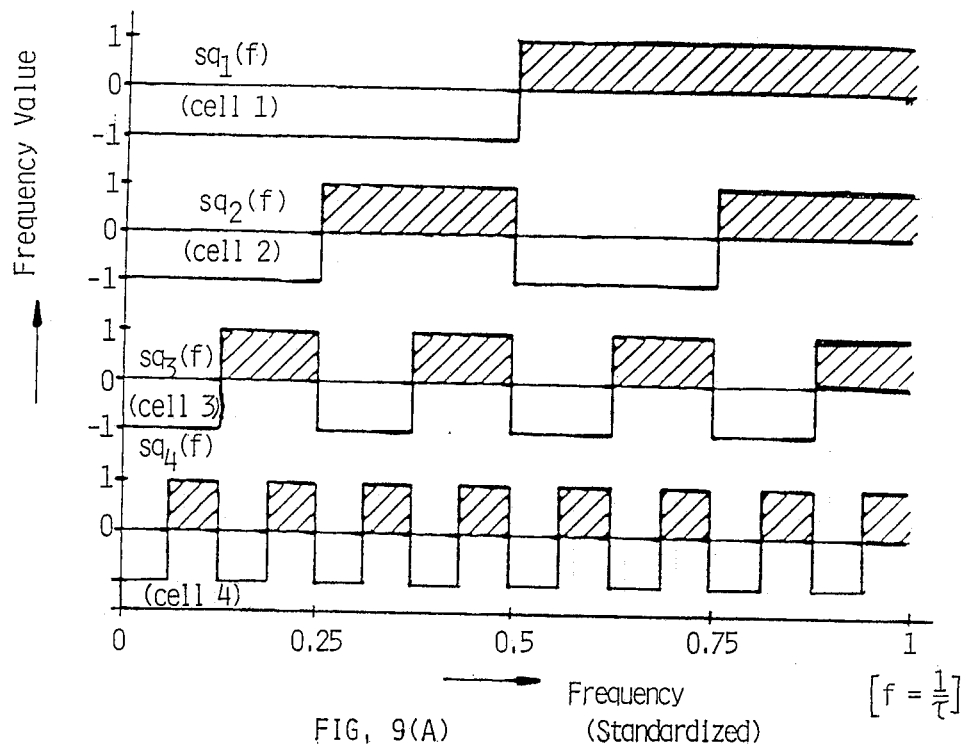
FIGS. 9A and 9B are graphs showing respectively the associated characteristics of the individual detector cells positions with the code values (B) of the coding range.
Figure 9B:
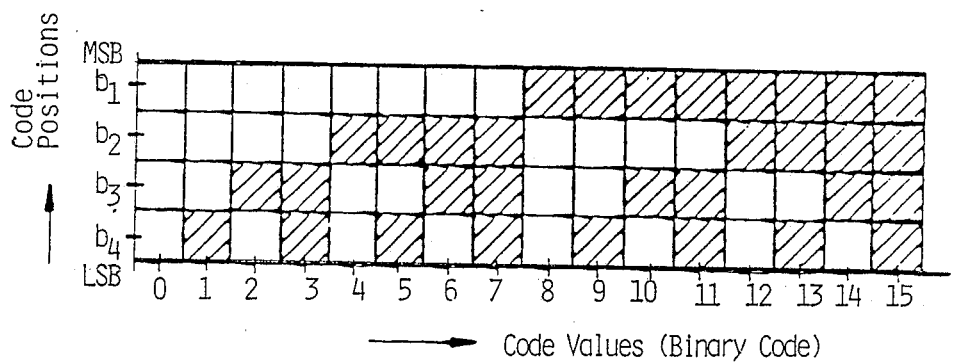

For example, the 4-bit momentary frequency detector DMFD constructed according to FIG. 8, furnishes the digital frequency value q(k) in a 4-bit binary code. In addition to the corresponding 16-way signal/phase distributor SPV which provides four identical sets of four phase positions of s(t), four detector cells in the form of a signal delay unit SVE together with digital frequency evaluator DFA which perform the momentary frequency detection, are required for the odd version (FIG. 3 or 7). The special feature of this detector circuit is the staggered delay by factors of 2 for the individual delay stages and detector cells. These signal delay conditions for representation of the frequency value q(k) in binary code result from the characteristic diagrams and binary code relationships with the individual characteristics as shown in FIG. 9. Thus, the following delays (first delay line, second delay line) apply for the individual detector cells with respect to their code positions:

cell 1 (odd): $2\tau$, $\tau$ for binary code position $b_1$, MSB;
cell 2 (odd): $4\tau$, $2\tau$ for binary code position $b_2$;
cell 3 (odd): $8\tau$, $4\tau$ for binary code position $b_3$;
cell 4 (odd): $16\tau$, $8\tau$ for binary code position $b_4$, LSB.

Figure 10:
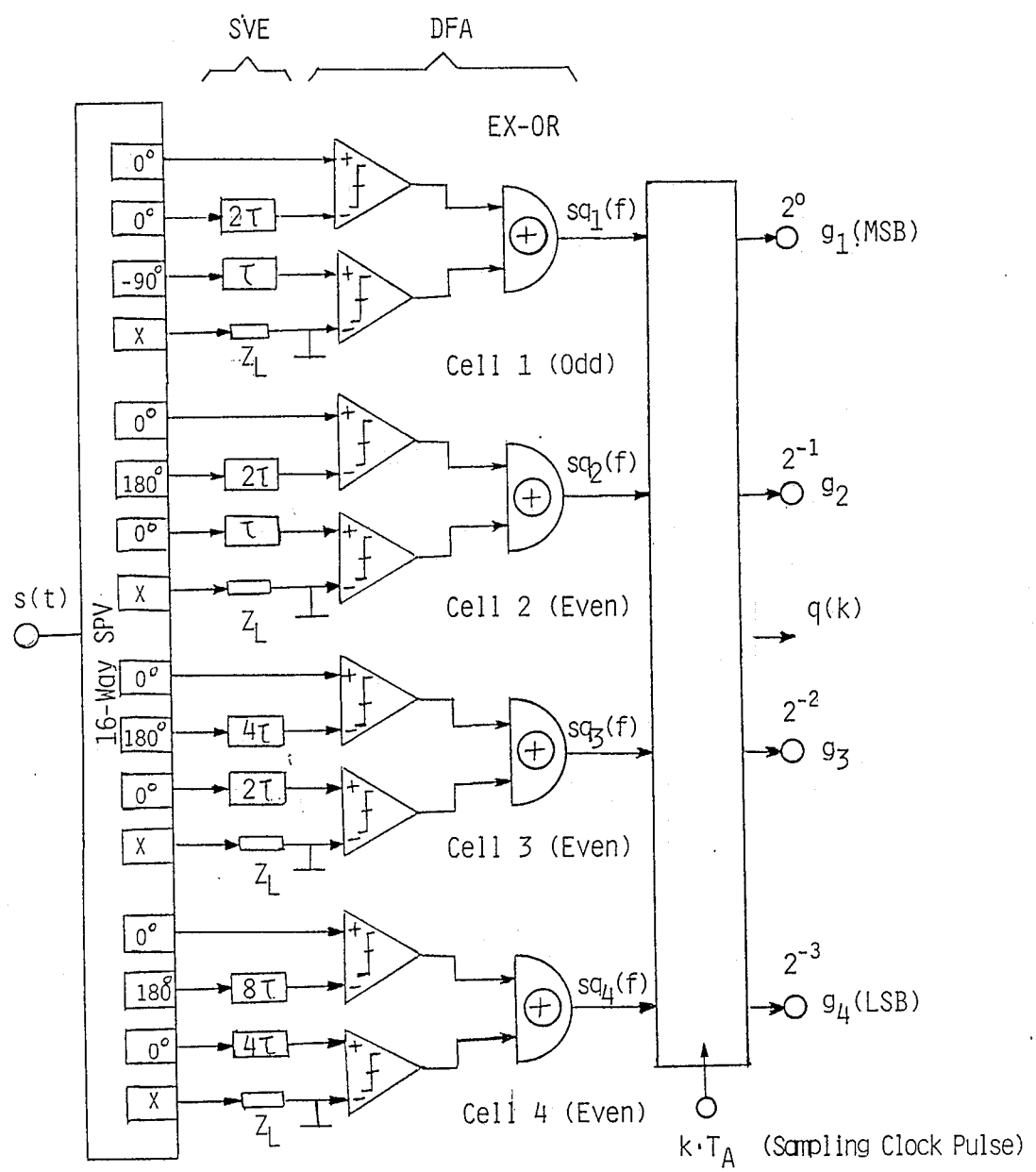
FIG. 10 is a circuit diagram of the structure of a 4-bit momentary frequency detection arrangement for frequency value output in a Gray code.

According to FIG. 10, the 4-bit momentary frequency detector DMFD for frequency value output q(k) in the Gray code has a similar structure. However, in contrast to the binary code detector described above, some different dimensions must be employed here. In this case, the 16-way signal/phase distributor SPV must make changed phase positions of s(t) available at its multiple outputs (the phase positions of the first set of four phase positions $s_{11}$ to $s_{14}$ differ. Also, the four detector cells to be employed now represent different versions. For example, the detector cell for the highest valued Gray code bit $g_1$ ($2^0$ value) is realized by an odd detector cell (FIG. 3A or 7). In contrast thereto, the lower valued Gray code bits $g_2$ to $g_4$ ($2^{-1}$ to $2^{-3}$ value) are obtained from even detector cells according to FIG. 2A or 6. Due to the characteristic diagrams for the Gray code, FIG. 11 indicates that new detector signal delays result as well. However, the basic delay staggering by the factor 2 remains in effect here as well. Accordingly, the following signal delays must be given here for the individual detector cells with respect to their code positions:

cell 1 (odd): $2\tau$, $\tau$ for Gray code position $g_1$, MSB;
cell 2 (even): $2\tau$, $\tau$ for Gray code position $g_2$;
cell 3 (even): $4\tau$, $2\tau$ for Gray code position $g_3$;
cell 4 (even): $8\tau$, $4\tau$ for Gray code position $g_4$, LSB.

Thus, in contrast to the binary code frequency detector, the maximum delay time of the Gray code frequency detector is only half as large (here $8\tau$ instead of $16\tau$).

A conventional 4-bit output register must then be provided at the output of the two 4-bit momentary frequency detector of FIG. 8 for a frequency output in the binary code as well as at the output of the 4-bit momentary frequency detector of FIG. 10 in the Gray code, so as to synchronize the data with the sampling clock pulse $K \cdot T_4$.

In addition to these described momentary frequency detector variations (either for binary code or for Gray code representation of the frequency values q(k)), other types of coding are also possible in principle. However, essentially only a version employing frequency value output in a mixed binary-Gray code, which will be described below, will probably be of interest for a practical realization.

Such an example for a 4-bit momentary frequency detector will be described with reference to FIG. 12. According to FIG. 13, this results in the following signal delays for the individual detector cells with respect to their code type and code positions, in each case for their first and second delay lines:

cell 1 (odd): $2\tau$, $\tau$ for binary code position $b_1$, MSB;
cell 2 (even): $2\tau$, $\tau$ for Gray code position $g_2$;
cell 3 (odd): $8\tau$, $4\tau$ for binary code positions $b_3$;
cell 4 (even): $8\tau$, $4\tau$ for Gray code position $g_4$, LSB.

In this case, the odd detector cells alternate with the even detector cells in the sequence from the most significant bit (MSB) to the least significant bit (LSB). Here again the internal signal delays with respect to the detector cells are identical in pairs. For a reduction to practice, this results in an advantageous signal delay staggered by a factor of 4 for the individual pairs of detector cells, each pair including an odd and an even cell with identical internal signal delays. This also considerably reduces costs for such digital momentary frequency detectors employing word widths N >4 bits. However, this advantage is somewhat adversely influenced by the resulting mixed binary-Gray code which generally cannot be processed further in this form. Yet, such a mixed code can very easily be converted, by way of EX-OR/NOR linkages (here represented by the symbol $\oplus$) to the binary code or the Gray code. In the case of the 4-bit momentary frequency detector DMFD according to FIGS. 12 and 13, the following logic recoding rules then result:

(a) for a conversion of the mixed code to the binary code:
$b_1 = b_1$
$b_2 = g_2 \oplus b_1$
$b_3 = b_3$
$b_4 = g_4 \oplus b_3$ (b) for a conversion of the mixed code to the Gray code:
$g_1 = b_1$
$g_2 = g_2$
$g_3 = b_1 \oplus g_2 \oplus b_3$
$g_4 = g_4$ Again, as in the two basic versions described earlier, the data are advisably output via a register.

Figure 14:
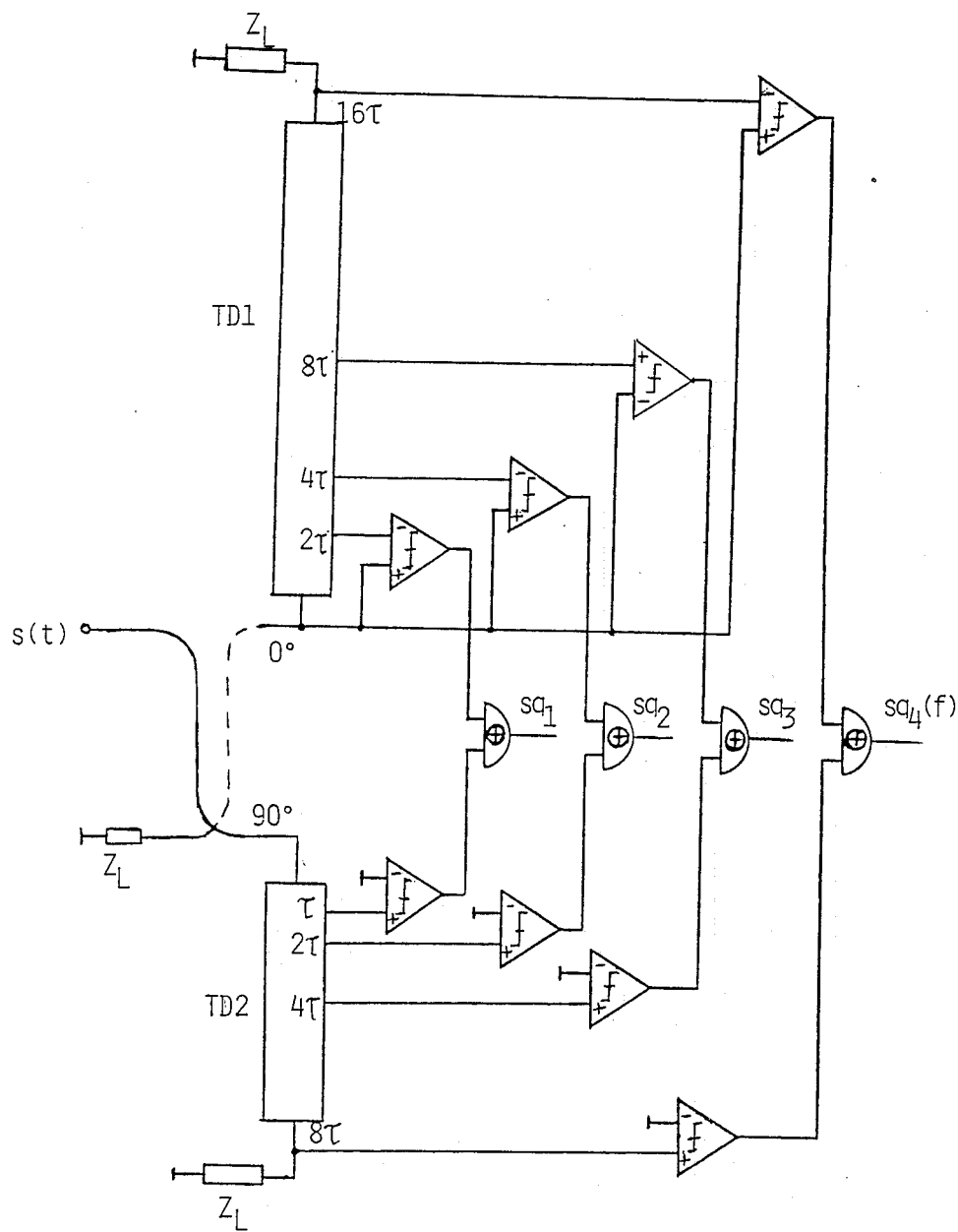
FIG. 14 is a circuit diagram similar to FIG. 8 but with only two tapped delay lines instead of numerous separate delay lines.

The signal/phase distributor and the signal delay unit may be modified by using tapped delay lines instead of several separate delay lines. An example for such a modification of the circuit diagram shown in FIG. 8 is illustrated in FIG. 14.

Because all of the cells are odd, there only appear signal phases at the outputs of signal/phase distributor having 0° or 90° phase shift with respect to the input signal s(t). As shown in FIG. 4 only one 3 dB 90° hybrid coupler is employed in the signal/phase distributor. The 0° output signal is fed to a first tapped delay line TD1 with a total time delay of $16\tau$ and taps at $2\tau$, $4\tau$ and $8\tau$. Similarly the −90° output signal of the hybrid coupler is fed to a second tapped delay line with a total time delay of $8\tau$ and taps at $\tau$, $2\tau$ and $4\tau$. The outputs of the delay lines are matched by impedances $Z_L$. The delayed and undelayed signal phases are processed further by comparators and EX-OR gates the same way as shown in FIG. 8.

Figure 12:
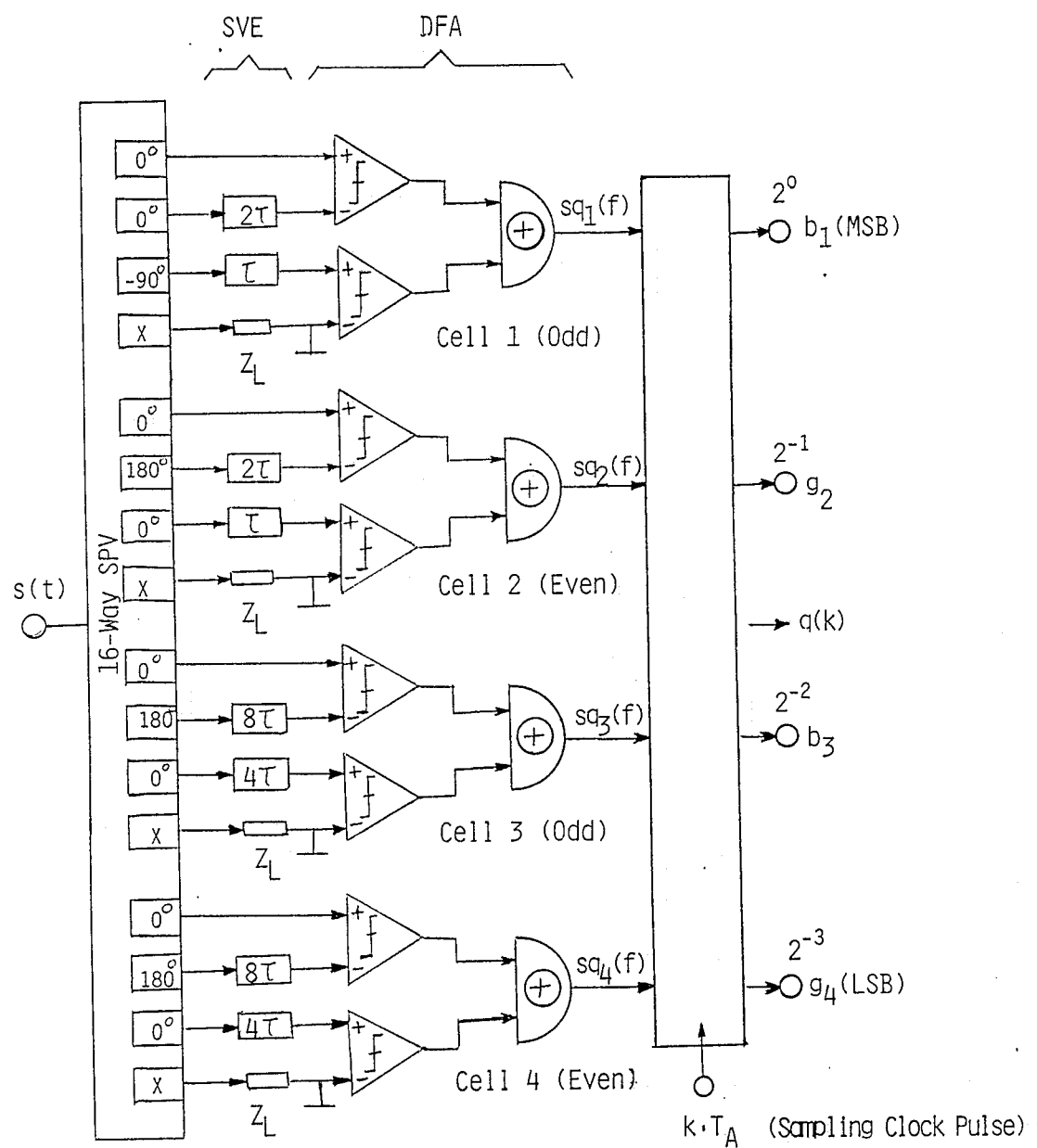
FIG. 12 is a circuit diagram of the structure of a 4-bit momentary frequency detection arrangement for a frequency value output in a mixture of binary code and Gray code.

In a similar manner the arrangements shown in FIGS. 10 and 12 may be modified by employing a signal/phase distributor as illustrated in FIG. 7, for example, with signal phases 0°, −90° and −180° phase shifts at its outputs. These signal phases may be fed to three (tapped) delay lines.

The present disclosure relates to the subject matter disclosed in Federal Republic of Germany Patent No. P 37 36 124.4 issued Oct. 26th, 1987, the entire specification of which is incorporated herein by reference.

It will be understood that the above description of the present invention is susceptible to various modifications, changes and adaptations, and the same are intended to be comprehended within the meaning and range of equivalents of the appended claims.

What is claimed is:

1. A method for determining a momentary frequency represented as an N-bit number in an N-bit coding range, where N a whole number greater than 1, of a signal s(t) which is variable over time t within a frequency band of a given bandwidth $\Delta f$, the method comprising the steps of:

a. distributing, phase shifting and delaying the signal s(t) to obtain N sets i of signal components, where $i = 1, \ldots, N$, each set i of signal components consisting of an odd set i or an even set i, each odd set i including an undelayed signal s(t), a first delayed signal $js(t - T_i)$ and a second delayed signal $s(t - 2T_i)$, wherein $T_i$ is equal to $2i - 1 \cdot \tau$ where $\tau$ is a common delay increment, and "j" represents a 90° phase shift of the signal, each even set i including the undelayed signal s(t), a third delayed signal s(t−$T_i$) and a fourth delayed signal s(t−$T_i$/2);

b. applying the sets i of signal components to respective ones of N parallel ordered evaluation stages i, where i=1, ..., N, each stage corresponding to a respective code position of the N-bit number to be determined and consisting of an odd evaluation stage i for producing an i-th output bit with an odd bit function with respect to the middle of the coding range, or an even evaluation stage i for producing an i-th output bit with an even bit function with respect to the middle of the coding range, each odd set i of signal components being applied to the odd evaluation stage i, each even set i of signal components being applied to the even evaluation stage i, the output bits of the evaluation stages forming the bits in the respective code positions of the N-bit number to be determined;

c. in each odd evaluation stage i concurrently,
 (1) forming in response to the odd set of signal components applied thereto:
  (i) a first intermediate signal having a first predetermined amplitude and the sign of s(t)−s(t−2$T_i$), and
  (ii) a second intermediate signal having the first predetermined amplitude and the sign of −js(t−$T_i$), and
 (2) adding the first and second intermediate signals by 1-bit modulo addition to obtain at an output of the odd evaluation stage the i-th output bit, the i-th output bit having a bit value for the respective code position, given by squi (t)=sgn [s(t)−s(t−2$T_i$)] ⊕ sgn [−js(t−$T_i$)], where "sgn" represents the sign function signum, and "⊕" represents 1-bit modulo addition; and d. in each even evaluation stage i concurrently with said steps of forming and adding in each odd evaluation stage i,
 (1) forming in response to the even set i of signal components applied thereto:
  (i) a third intermediate signal having a second predetermined amplitude and the sign of s(t)+s(t−$T_i$), and
  (ii) a fourth intermediate signal having said second predetermined amplitude and the sign of s(t−$T_i$/2), and
 (2) adding the third and fourth intermediate signals by 1-bit modulo addition to obtain at an output of said even evaluation stage the i-th output bit, the i-th output bit having a bit value for the respective code position, given by sqgi (t)=sgn [s(t)+s(t−$T_i$)] ⊕ sgn [s(t−$T_i$/2)];

whereby the momentary frequency is obtained at the outputs of the odd and even evaluation stages as the N-bit number having at the i-th bit location, where i=1, ..., N, the bit value sqgi (t) for bits having an even bit function and the bit value squi (t) for bits having a odd bit function.

2. A method as in claim 1, further comprising the step of sampling the bit values from the outputs of the odd and even cells at a low frequency.

3. A method as in claim 1, wherein the common time increment τ is equal to 1/Δf.

4. A circuit for determining a momentary frequency represented as an N-bit number in an N-bit coding range, where N is a whole number greater than 1, of a signal s(t) which is variable over time t within a frequency band of a given bandwidth Δf, the circuit comprising:

a. means, responsive to receipt of the signal s(t), for distributing, phase shifting and delaying the signal s(t), to obtain N sets i of three signal components, where i=1, ..., N, each set i of signal components consisting of an odd set i or an even set i, said means for distributing, phase shifting and delaying including:
 (1) first means for distributing, phase shifting and delaying s(t) to obtain for each i for which the set i is an odd set, the three signal components of the odd set i in the form of an undelayed signal s(t), a first delayed signal js(t−$T_i$) and a second delayed signal s(t−2$T_i$), wherein $T_i$ is equal to 2i−1·τ where τ is a common delay increment, and "j" represents a 90° phase shift of the signal, and
 (2) second means for distributing, phase shifting and delaying s(t) to obtain for each i for which the set i is an even set, the three signal components of the even set i in the form of an undelayed signal s(t), a third delayed signal −s(t−$T_i$) and a fourth delayed signal s(t−$T_i$/2); and b. N parallel ordered evaluation stages i, where i=1, ..., N, each stage corresponding to a respective code position of the N-bit number to be determined, each stage consisting of either:
 (1) an odd evaluation stage i having an output and means, coupled to said distributing, phase shifting and delaying means so as to receive the odd set i of signal components therefrom, for producing at said output an i-th output bit with an odd bit function with respect to the middle of the coding range, or
 (2) an even evaluation stage i having an output and means, coupled to said distributing, phase shifting and delaying means so as to receive the even set i of signal components therefrom, for producing at said output an i-th output bit with an even bit function with respect to the middle of the coding range,
 (3) the output bits of the evaluation stages forming the bits in the respective code positions of the N-bit number to be determined;

c. each means for producing an i-th output bit with an odd bit function including:
 (1) means for forming in response to the odd set i of signal components received by said odd evaluation stage i:
  (i) a first intermediate signal having a first predetermined amplitude and the sign of s(t)−s(t−2$T_i$), and
  (ii) a second intermediate signal having said first predetermined amplitude and the sign of −js(t−$T_i$), and
 (2) first adding means for adding the first and second intermediate signals by 1-bit modulo addition to obtain at the output of said odd evaluation stage i the i-th output bit, the i-th output bit having a bit value for the respective code position, given by squi (t)=sgn [s(t)−s(t−2$T_i$)] ⊕ sgn [−js(t−$T_i$)], where "sgn" represents the sign function signum,, and "⊕" represents 1-bit modulo addition; and d. each means for producing an i-th output bit with an even bit function including:

(1) means for forming in response to the even set of signal components received by said even evaluation stage i:
  (i) a third intermediate signal having a second predetermined amplitude and the sign of $s(t)+s(t-T_i)$, and
  (ii) a fourth intermediate signal having said second predetermined amplitude and the sign of $s(t-T_i/2)$, and
(2) second adding means for adding the third and fourth intermediate signals by 1-bit modulo addition to obtain at the output of said even evaluation stage i the i-th output bit, the i-th output bit having a bit value for the respective code position, given by $sqg_i(t) = sgn\,[s(t)+s(t-T_i)] \oplus sgn\,[s(t-T_i/2)]$;

whereby the momentary frequency is obtained at the outputs of the odd and even evaluation stages as the N-bit number having at the i-th bit location, where $i=1, \ldots, N$, the bit value $sqg_i(t)$ for bits having an even bit function and the bit value $squ_i(t)$ for bits having a odd bit function.

5. A method as in claim 4, wherein the common time increment $\tau$ is equal to $1/\Delta f$.

6. A circuit as in claim 4, wherein the means for forming the first and second intermediate signals comprises a first comparing means for comparing the signal $s(t)$ to the delayed signal $s(t-2T_i)$ to determine the sign of $s(t)-s(t-2T_i)$ and means for forming the second intermediate signal having the first predetermined amplitude and the sign of $-js(t-T_i)$; the means for forming the third and fourth intermediate signals comprises a second comparing means for comparing the signal $s(t)$ to the delayed signal $-s(t-T_i)$ to determine the sign of $s(t)+s(t-T_i)$ and means for forming the fourth intermediate signal having the second predetermined amplitude and the sign of $-s(t-T_i/2)$; and the first and second comparing means, the means for forming the second intermediate signal and the means for forming the fourth intermediate signal each includes a respective comparator, the first adding means includes an exclusive nor gate, and the second adding means includes an exclusive or gate.

7. A circuit as in claim 4, wherein said N evaluation stages in the order thereof alternate consecutively between odd evaluation stages and even evaluation stages.

8. A circuit as in claim 4, wherein the common time increment $\tau$ is equal to $1/\Delta f$.

9. A circuit as in claim 4, wherein said first and second distributing, phase shifting and delaying means include:
  a signal/phase distributor means having an input for receiving the signal $s(t)$ and a first output and at least one of a second output and a third output, said signal/phase distributor means including means for concurrently producing from the signal $s(t)$ at its input a signal of zero phase position defined by $s(t)$ at its input a signal of zero phase position defined by $s(t)$ at the first output, a signal of $-90°$ phase position defined by $-js(t)$ where j represents a 90° phase shift, at the second output, and a signal of 180° phase position defined by $-s(t)$, at the third output; and
  N ordered delay stages i, $i=1, \ldots, N$, each delay stage corresponding to a respective code position of the N-bit number to be determined and consisting of one of an odd delay stage and an even delay stage;

each odd delay stage i comprising:
  a first delay means, coupled to the second output of the signal/phase distributor means, for delaying $-js(t)$ by $T_i$ to obtain the signal component which forms the first delayed signal $-js(t-T_i)$, and
  a second delay means, coupled to the first output of the signal phase/distributor means, for delaying $s(t)$ by $2T_i$ to obtain the signal component which forms the second delayed signal $s(t-2T_i)$;

each even delay stage i comprising:
  a third delay means, coupled to the third output of the signal phase/distributor means, for delaying $-s(t)$ by $T_i$ to obtain the signal component which forms the third delayed signal $-s(t-T_i)$, and
  a fourth delay means, coupled to the first output of the signal phase/distributor means, for delaying $s(t)$ by $T_i/2$ to obtain the signal component which forms the fourth delayed signal $s(t-T_i/2)$.

10. A circuit as in claim 9, wherein said signal/phase distributor means includes a plurality of 3dB hybrid couplers, each of said couplers having said first output and one of said second and said third outputs.

11. A circuit as in claim 9, wherein each of said delay stages includes three signal paths, said paths having delays which are staggered by a same delay difference amount.

12. A circuit as in claim 9, wherein the means for forming the first and second intermediate signals comprises a first comparing means for comparing the signal $s(t)$ to the delayed signal $s(t-2T_i)$ to determine the sign of $s(t)-s(t-2T_i)$ and means for forming the second intermediate signal having the first predetermined amplitude and the sign of $-js(t-T_i)$; the means for forming the third and fourth intermediate signals comprises a second comparing means for comparing the signal $s(t)$ to the delayed signal $-s(t-T_i)$ to determine the sign of $s(t)$ to the delayed signal $-s(t-T_i)$ to determine the sign of $s(t)+s(t-T_i)$ and means for forming the fourth intermediate signal having the second predetermined amplitude and the sign of $-s(t-T_i/2)$; and the first and second comparing means, the means for forming the second intermediate signal and the means for forming the fourth intermediate signal each includes a respective comparator, the first adding means includes an exclusive nor gate, and the second adding means includes an exclusive or gate.

13. A circuit as in claim 9, wherein said N delay stages in the order thereof alternate between odd delay stages and even delay stages, and said N evaluation stages in the order thereof alternate between even evaluation stages and odd evaluation stages.

14. A circuit as in claim 9, wherein the common time increment $\tau$ is equal to $1/\Delta f$.

15. A method for determining a momentary frequency represented as an N-bit number in an N-bit coding range, where N is a whole number greater than 1, of a signal $s(t)$ which is variable over time t within a frequency band of a given bandwidth $\Delta f$, the method comprising the steps of:
  a. distributing, phase shifting and delaying the signal $s(t)$ to obtain N sets i of three signal components, where $i=1, \ldots, N$, the set i for each i, where $i=1, \ldots, N$, including an undelayed signal $s(t)$, a first delayed signal $js(t-T_i)$ and a second delayed signal $s(t-2T_i)$, wherein $T_i$ is equal to $2i-1 \cdot \tau$ where $\tau$ is a common delay increment, and "j" represents a 90° phase shift of the signal;

b. applying the sets i of signal components to respective ones of N parallel ordered evaluation stages i, i=1,..., N, each stage corresponding to a respective code position of the N-bit number to be determined and having means for producing an i-th output bit with an odd bit function with respect to the middle of the coding range, the output bits of the evaluation stages forming the bits in the respective code positions of the N-bit number to be determined; and c. in each evaluation stage i concurrently,
  1. forming in response to the set i of signal components applied thereto:
     a first intermediate signal having a first predetermined amplitude and the sign of $s(t)-s(t-2T_i)$, and
     a second intermediate signal having said first predetermined amplitude and the sign of $-js(t-T_i)$, and
  2. adding the first and second intermediate signals by 1-bit modulo addition to obtain at an output of said odd evaluation stage the i-th output bit, the i-th output bit having a bit value for the respective code position, given by squi (t)=sgn $[s(t)-s(t-2T_i)]$ $\oplus$ sgn $[-js(t-T_i)]$, where "sgn" represents the sign function signum, and $\oplus$ represents 1-bit modulo addition;

whereby the momentary frequency is obtained at the outputs of the evaluation stages as the N-bit number having at the i-th bit location, where i=1,..., N, the bit value squi (t).

16. A circuit for determining a momentary frequency represented as an N-bit number in an N-bit coding range, where N is a whole number greater than 1, of a signal s(t) which is variable over time t within a frequency band of a given bandwidth $\Delta f$, the circuit comprising:

a. means, responsive to receipt of the signal s(t), for distributing, phase shifting and delaying the signal s(t) to obtain N sets i, where i=1,..., N, of signal components, each set i including three signal components in the form of an undelayed signal s(t), a first delayed signal $js(t-T_i)$ and a second delayed signal $s(t-2T_i)$, wherein $T_i$ is equal to $2i-1\cdot\tau$ where $\tau$ is a common delay increment, and "j" represents a 90° phase shift of the signal; and b. N parallel ordered evaluation stages i, where i=1,..., N, each stage i corresponding to a respective code position of the N-bit number to be determined and having means, coupled to said distributing, phase shifting and delaying means so as to receive the set i of signal components therefrom, for producing at an output thereof an i-th output bit with an odd bit function with respect to the middle of the coding range, the output bits of the evaluation stages forming the bits in the respective code positions of the N-bit number to be determined;

c. each means for producing an i-th output bit with an odd bit function including:
  1. means for forming in response to the set of signal components received by the evaluation stage i:
     a first intermediate signal having a first predetermined amplitude and the sign of $s(t)-s(t-2T_i)$, and
     a second intermediate signal having said first predetermined amplitude and the sign of $-js(t-T_i)$, and
  2. adding means for adding the first and second intermediate signals by 1-bit modulo addition to obtain at the output of said evaluation stage i the i-th output bit, the i-th output bit having a bit value for the respective code position, given by squi (t)=sgn $[s(t)-s(t-2T_i)]$ $\oplus$ sgn $[-js(t-T_i)]$, where "sgn" represents the sign function signum, and "$\oplus$" represents 1-bit modulo addition;

whereby the momentary frequency is obtained at the outputs of the evaluation stages as the N-bit number having at the i-th bit location, where i=1,..., N, the bit value squi (t).

17. A circuit as in claim 16, wherein the first comparing means and the means for forming the second intermediate signal each includes a respective comparator, and the adding means includes an exclusive nor gate.

18. A circuit as in claim 16, wherein the common time increment $\tau$ is equal to $1/\Delta f$.

19. A circuit as in claim 16, wherein said distributing, phase shifting and delaying means includes:
  a signal/phase distributor means having an input for receiving the signal s(t), a first output and a second output, said signal/phase distributor means including means for concurrently producing from the signal s(t) at its input a signal of zero phase position defined by s(t) at the first output and a signal of $-90°$ phase position defined by $-js(t)$ where j represents a 90° phase shift, at the second output; and
  N ordered delay stages i, i=1,..., N, each delay stage corresponding to a respective code position of the N-bit number to be determined and comprising:
    a first delay means coupled to the second output of the signal/phase distributor means for delaying $-js(t)$ by $T_i$ to obtain the signal component which forms the first delayed signal $-js(t-T_i)$, and
    a second delay means coupled to the first output of the signal phase/distributor means for delaying s(t) by $2T_i$ to obtain the signal component which forms the second delayed signal $s(t-2T\cdot1 i)$.

20. A circuit as in claim 19, wherein said signal/phase distributor means includes a plurality of 3 dB hybrid couplers, each having said first output and one of said second and said third outputs.

21. A circuit as in claim 19, wherein each of said delay stages includes three signal paths having delays which are staggered by a same delay difference amount.

* * * * *